United States Patent
Bakker et al.

(10) Patent No.: US 7,683,660 B1
(45) Date of Patent: Mar. 23, 2010

(54) PROGRAMMABLE LOGIC DEVICE WITH A MICROCONTROLLER-BASED CONTROL SYSTEM

(75) Inventors: Gregory Bakker, San Jose, CA (US); Joel Landry, Colorado Springs, CO (US); William C. Plants, Campbell, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/023,299

(22) Filed: Jan. 31, 2008

(51) Int. Cl.
*H03K 19/173* (2006.01)
(52) U.S. Cl. .......................................... 326/38; 326/41
(58) Field of Classification Search .............. 326/37–41
See application file for complete search history.

(56) References Cited

U.S. PATENT DOCUMENTS

| | | | |
|---|---|---|---|
| 6,624,658 B2 * | 9/2003 | Pani et al. ..................... | 326/41 |
| 7,081,771 B2 | 7/2006 | Agrawal et al. | |
| 7,215,139 B2 | 5/2007 | Agrawal et al. | |

OTHER PUBLICATIONS

Virtex-II Pro and Virtex-II Pro X Platform FPGAs: Functional Description, Product Specification, DS083 (v4.7), [Internet] http://www.xlinix.com/support/documentation/data_sheets/ds083.pdf, Xilinx, Inc., Nov. 5, 2007, Module 2 of 4, pp. 1, 18-23, San Jose, CA, USA.

* cited by examiner

*Primary Examiner*—Don P Le
(74) *Attorney, Agent, or Firm*—Lewis and Roca LLP (57) ABSTRACT

A computer program product in a computer-readable medium for use in a microcontroller-based control system in a programmable logic integrated circuit device is disclosed. The computer program product comprises first instructions for initializing the device, second instructions for reading programming data from a data source external to the programmable logic integrated circuit device, third instructions for transferring the programming data into control elements internal to the programmable logic integrated circuit device. Provision is made for fourth instructions for saving at least a part of the internal logic state of the user logic programmed into the programmable logic integrated circuit device into a non-volatile memory block and for fifth instructions for restoring at least a part of the internal logic state of the user logic programmed into the programmable logic integrated circuit device from a non-volatile memory block. The programmable logic integrated circuit device, comprises a microcontroller block and a programmable logic block with programming circuitry, and has a sub-bus which couples the microcontroller block to the programming circuitry.

8 Claims, 9 Drawing Sheets

PROGRAMMABLE LOGIC DEVICE WITH A MICROCONTROLLER-BASED CONTROL SYSTEM

BACKGROUND OF THE INVENTION

1. Field of the Invention

The invention pertains to the field of integrated circuits. More particularly, the invention pertains to programmable logic integrated circuit devices.

2. Description of Related Art

Programmable logic integrated circuit devices (PLDs) are known in the art. A PLD comprises a programmable logic block with any number of initially uncommitted logic modules arranged in a programmable logic array along with an appropriate amount of initially uncommitted routing resources. Logic modules are circuits which can be configured to perform a variety of logic functions like, for example, AND-gates, OR-gates, NAND-gates, NOR-gates, XOR-gates, XNOR-gates, inverters, multiplexers, adders, latches, and flip/flops. Routing resources can include a mix of components such as, for example, wires, switches, multiplexers, and buffers. Logic modules, routing resources, and other features like, for example, I/O buffers and memory blocks, are the programmable elements of the PLD.

The programmable elements have associated control elements (sometimes known as programming bits or configuration bits) which determine their functionality. The control elements may be thought of as binary bits having values such as on/off, conductive/non-conductive, true/false, or logic-1/logic-0 depending on the context. The control elements vary according to the technology employed and their mode of data storage may be either volatile or non-volatile. Volatile control elements, such as SRAM bits, lose their programming data when the PLD power supply is disconnected, disabled or turned off. Non-volatile control elements, such as antifuses and floating gate transistors, do not lose their programming data when the PLD power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the logic modules and routing resources can vary greatly and must be appropriate for the type of control element used.

Like most integrated circuits, PLDs typically have an input/output (I/O) ring surrounding a central core, though other approaches are possible. The I/O ring contains the input and output buffers that interface to circuits external to the PLD as well as the power supply and ground connections. Some of the input and output buffers are typically dedicated to control functions. Others are programmable elements which can be part of an end user's logic design. It is common for the programmable element inputs and outputs (also called user inputs or user input buffers and user outputs or user output buffers) to pair equal numbers of input buffers and output buffers together to form input/output buffers (also called I/O buffers or user I/O buffers or user I/Os or sometimes simply I/Os). In some PLDs, one or more of the inputs, outputs, or I/Os can be shared between user logic design functions and control functions.

In a pure PLD, the central core contains a programmable logic block comprising the majority of the programmable elements and control elements. The programmable logic block also typically contains a variety of control circuits. There may be other control circuits present either inside the central core or inside the I/O ring or divided between the central core and the I/O ring. This control circuitry handles various tasks such as testing the PLD functionality, programming the control elements, or transitioning the PLD from one mode of operation to another. In a hybrid PLD, there are typically other function blocks available to the user during normal operation such as central processing units, analog blocks, custom logic blocks, and large volatile or non-volatile memory blocks. In some cases, the programmable logic block may be a minority of the total central core circuitry.

An end user's logic design is typically implemented by use of a computer program product (also known as software or, more specifically, design software) produced by the PLD manufacturer and distributed by means of a computer-readable medium such as providing a CD-ROM to the end user or making the design software downloadable over the internet. Typically the manufacturer supplies a library of design elements (also known as library elements) as part of the computer program product. The library design elements provide a layer of insulation between the end user and the circuit details of the programmable elements, control elements, and the other PLD features available to the end user. This makes the design software easier to use for the end user and simplifies the manufacturer's task of processing the end user's logic design by the various tools in the design software.

Once the end user's logic design is complete, the design software produces the data structure necessary to program the PLD. This typically results in a data structure containing a binary bit for each control element in the PLD (also known as programming data or bit stream data) in a computer readable medium appropriate for use in the end user's system. For SRAM-based PLDs this is typically a PROM (or EPROM or EEPROM or flash PROM) mounted on the printed circuit board next to the PLD. For antifuse-based and most floating gate transistor-based PLDs, this is typically a file stored on a hard disk, CD-ROM, or similar device. This file can then be transferred to a programming system where the PLD is programmed prior to installation in the end user's system. Alternatively, the file can be used for In System Programming (ISP) after the PLD is installed.

In the PLDs of the prior art, there are control circuits present on the integrated circuit device which assist the programming process. For example, in the AX antifuse-based field programmable gate array (FPGA) family offered by Actel Corporation of Mountain View, Calif., there is a JTAG compatible test port which allows an external programmer to manipulate state-machine based logic to transfer a serial bit stream of programming data from the external programmer to the internal control elements. (FPGAs are a type of PLD.)

Another example is Actel's ProASIC3 flash-based family FPGA. While the internal circuitry is very different from the AX family due to the different programming technology, this family also has a JTAG port coupled to state machine-based logic which an external programmer uses to transfer the programming data to the configurable elements.

Typically while a PLD is being programmed, the device is placed in a special programming mode where normal operation of the logic design in the programmable logic array in the programmable logic block is disabled. Once programmed, the control logic allows the PLD to be operated normally according to the end user's logic design.

A significant limitation of the control circuits of the prior art is their lack of flexibility. A JTAG port can only execute the instructions its designer hardwires into it. Similarly, a state machine can only perform the tasks dictated by its state diagram and transition table. Even a very sophisticated state machine-based control system like the one in the ProASIC3 family which has a non-volatile flash memory on board which is used to parameterize its functionality is restricted to the operations dictated by its hard-wired structure and cannot be used in a manner not anticipated by its designer.

There are several reasons why this can be significant. First, a PLD with prior art control logic may not work properly the first time a new product is manufactured. Identifying the problem can be a long and arduous task, and if the debug process requires the control logic to do something outside its design and parameter limits, it can be difficult or impossible to make a correct diagnosis. Second, the proper operation of a PLD depends greatly on the semiconductor process in which it is manufactured. If some change in the process occurs that requires a new or different programming technique that is outside the capabilities of the control logic, it must be redesigned to implement the new functionality. Third, there are many tasks on complicated, high-end PLDs, such as testing certain portions of the PLD not easily accessible by means of programming or external pins, that are implemented by extending the functionality of the control logic to cover those operations. This can make the design of the control logic even more complicated and potentially error prone.

Employing CPUs on PLDs for microcontroller applications is known in the art. For example, Xilinx, Inc., of San Jose, Calif. offers hardware Power PC 405 RISC processor cores in its Virtex-2 PRO line of FPGAs. Several FPGA manufactures offer soft processor cores that can be built out of logic modules and routing resources like, for example, the Nios processor core offered by Altera Corporation of San Jose, Calif., and the ARM7 processor core offered by Actel. However, none of these prior art processors can be used for programming the PLD or performing other PLD internal control functions and can only be accessed as part of an end user's logic design. By using a microcontroller to replace the control logic, all of the limitations of the prior art discussed above can be overcome since the control function becomes a computer program product in a computer readable medium (software, or more particularly known as firmware in microcontroller applications) which can be changed with relative ease if the need arises—particularly in a non-volatile technology where the new software can be stored and remain on-chip by means of programming control elements. Furthermore, by utilizing the microcontroller to perform other tasks, and not just for programming and test functions, additional functionality can be offered to the end user that is completely unavailable in prior art PLDs.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

In the PLD of the present invention, a portion of the control logic is replaced by an on-chip microcontroller circuit block or system. The term microcontroller is used in a way that is consistent with the way the term is normally understood by those skilled in the art. Specifically a microcontroller is a self-contained computer which typically contains a central processing unit (CPU), an adequate amount of both volatile memory (typically flash or EEPROM) and non-volatile memory (typically SRAM) for the required tasks, and sufficient interface circuitry to interact with its environment and operate in a largely self-sufficient manner. Typically the non-volatile memory is used to store the software programs that the microcontroller runs during operation, though it can be used for other purposes like, for example, data logging. Typically the volatile memory is used as a scratchpad for temporary data storage, though software can be loaded from outside the microcontroller into the SRAM and executed when necessary.

Figure 1:
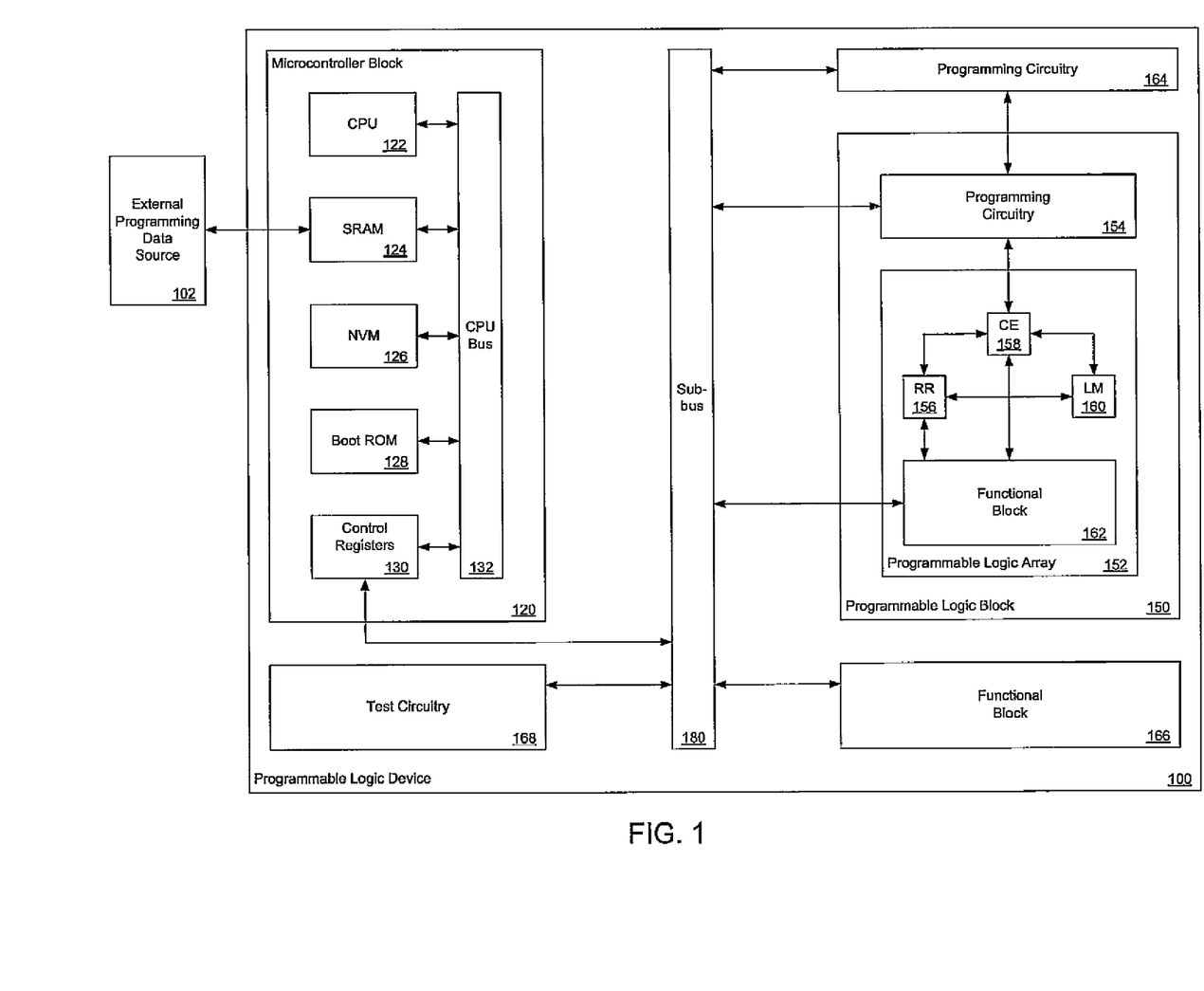
FIG. 1 shows a first illustrative embodiment of a PLD of the present invention.

Turning to FIG. 1, a PLD of the present invention generally indicated by reference number 100 is coupled to an external programming data source 102. External programming data source 102 could be, for example, a PROM of some sort, a configuration bit stream from a PLD programmer, or even a file downloaded from the internet depending on how the end user wishes to program the PLD and the limitations of the particular technology employed in the PLD itself.

PLD 100 has a microcontroller block indicated by reference number 120. Microcontroller block 120 is shown further comprising CPU block 122, static random access memory (SRAM) block 124, non-volatile memory (NVM) block 126, boot ROM (read-only memory) block 128, control registers 130, and CPU bus 132. This is a very generic configuration for an embedded microcontroller system. Persons skilled in the art will realize than many different CPUs could be used and many other configurations are known which would be suitable for use with the present invention and the actual configuration selected in a particular PLD is largely a matter of design choice. For example, some CPUs support more than one processor, some support more than one CPU bus, some divide memory into different types that are accessed with different instructions (or opcodes) or by means of different CPU busses, some organize control registers differently, etc. Such skilled persons will realize that while it is typically most desirable to build the microcontroller system as a single block, it is also possible that the various blocks shown as internal to Microcontroller Block 120 could be distributed in different locations on the PLD as a matter of design choice.

The CPU 122 is a type of logic machine that executes a series of instructions. It typically contains logic for fetching instructions and reading data from memory, internal registers for temporarily storing data, logic for performing logical and arithmetic operations on the contents of its internal registers, and logic for writing data to external locations. Persons skilled in the art will realize that many processors would be suitable for use with the present invention and using a particular processor is design choice and is in no way limiting.

SRAM block 124 provides scratch pad memory to CPU 122. Processors need readable and writeable memory to temporarily store programs and data. The amount of memory in the SRAM block is a matter of design choice.

NVM block 126 provides more permanent storage of data and programs, since the contents persist even if the PLD is powered down. NVM blocks are typically only available in PLDs built using flash technology, or in modules where a PLD is coupled to a separate NVM device like, for example, a flash memory, an EPROM, or an EEPROM, in a single package. In general, reading from a flash NVM can be done very quickly, while writing or erasing data can take thousands of processor clock cycles to accomplish.

In technologies where an on-chip NVM is inherently unavailable, another approach may be employed. For example, in an antifuse-base PLD of the present invention, the NVM block 126 could be replaced by an antifuse PROM (programmable read-only memory) which could be left completely or partially full after programming. If partially full after the initial programming, data or programs could be written to and used during the course of the product life until the PROM is full. However, once it becomes full, the PROM can no longer be written. The size of the NVM block (or antifuse PROM or alternative) is a matter of design choice.

Boot ROM block 128 contains hardwired programs (or boot firmware) and data for CPU 122 that are essential to beginning operation when the PLD powers up and the CPU 122 needs to initialize the PLD. On a power up or a system reset, CPU 122 starts executing program code at a pre-defined memory location in the boot PROM 128. The boot firmware begins initialization of the PLD and various other functions which must be performed. The amount of memory in the Boot ROM block is a matter of design choice.

In a flash-based PLD of the present invention, the boot firmware needs to determine if the part has been programmed—including the control software (or main firmware) for the CPU 122. In this case, the boot firmware would check the contents of NVM block 126 to see if the main firmware had already been programmed into the PLD. If so, control would be passed to the appropriate address in the NVM block where the main firmware starts and the CPU 122 would start executing the firmware from that point. Then the main firmware would handle the remainder of the PLD initialization and then either program the rest of the PLD from an external data source (if the PLD is unprogrammed) or place the PLD in normal operating mode so the end user's logic design can begin operating. Once in normal operating mode, the main firmware would continue to operate and perform any operations requested by the end user's logic design. If the boot firmware determines that the main firmware has not been loaded, the boot firmware would then look at certain external I/Os to determine if a recognized external programming data source 102 was present. If so, it would erase the contents of the NVM block 126 and begin writing the main firmware into it. If no external data source is detected, the boot firmware would assume that the PLD was either to be programmed or tested under external control and would wait for further instructions from external I/Os.

In an antifuse based PLD of the present invention, the procedure is similar except that an antifuse PROM block replacing NVM block 126 can only be written and not erased. Thus potentially different versions of the main firmware could be present in the antifuse PROM and the boot firmware would have to determine which was the most recent before turning control over to it.

In an SRAM-based PLD of the present invention, no NVM block 126 or antifuse PROM or other replacement may be available, though there are some options available to the PLD designer. For example, the boot firmware could part of the main firmware and both are stored in the boot ROM. Upon power up or system reset conditions the main firmware starts operating, initializes the PLD, loads the bit stream from an external data source, and then places the PLD in normal operating mode so the end user's logic design can begin operating. Once in normal operating mode, the main firmware would continue to operate and perform any operations requested by the end user's logic design. While providing many of the advantages of the flash and antifuse approaches, this option lacks considerable flexibility if changes need to be made, since the main firmware is hardwired into a ROM. Alternatively, the main firmware is loaded as part of the programming data. Thus the boot firmware must load the main firmware into SRAM block 124 and the SRAM control elements in the programmable logic array (and elsewhere if present), or load the main firmware which then takes over and loads the SRAM control elements. While also providing many of the advantages of the flash and antifuse approaches, there is a significant security risk associated with exposing the main firmware outside the PLD, even if it is encrypted, since if unauthorized third parties manage to compromise the main firmware the intellectual property contained in the end user's design is at risk of being exposed and copied.

Microcontroller block 120 further comprises Control Register block 130. Typically, control registers are the way in which CPUs control external functions. Control registers can be typically be written to and read from like SRAM (though occasionally read-only registers and write-only registers are used) and may share the main memory address space or have their own separate address space. Unlike conventional SRAM, the internal data storage element of control register bits are coupled to external logic to transmit data to and receive data from outside the microcontroller block.

In one embodiment of the present invention, control registers are used to communicate with a large variety of different blocks on board the PLD, while some addresses in the SRAM address space are used as control registers for importing external data for External Programming Data Source 102. Persons skilled in the art will realize there are many other ways to implement these functions internal or external to the microcontroller block and that the specific method of implementation is a matter of design choice.

Microcontroller block 120 further comprises CPU Bus 132. A CPU bus is primarily a number of address lines, data lines, and control lines that allows the CPU to communicate with the various other components inside microcontroller block 120 and possibly other blocks outside of it, though other circuits like, for example, drivers, buffers and level restorers may be present. The details of construction of CPU Bus 132 typically depend upon the CPU 122 that is chosen for the design and SRAM block 124, NVM block 126, Boot Rom block 128 and Control Registers 130 must conform in order for the system to function properly. Some processors have a plurality of CPU busses and it is possible that more than one is present inside Microcontroller block 120.

PLD 100 also comprises Programmable Logic Block 150 which further comprises Programmable Logic Array 152 and Programming Circuitry 154. Programmable Logic Array 152 further comprises Routing Resources (RR) 156, Control Elements (CE) 158, Logic Modules (LM) 160 and Functional Block 162. Persons skilled in the art will realize that the representation of Routing Resources 156, Control Elements 158 and Logic Modules 160 as blocks is an abstraction and that these circuits are distributed in a regular manner across Programmable Logic Array 152. In FIG. 1 Routing Resources 156, Control Elements 158 and Logic Modules 160 are all shown cross-coupled together. This too is an abstraction because there often isn't a clear distinction between how to classify individual elements in a programmable logic array depending on the technology being employed. For example, in an antifuse based PLD connections between routing tracks are made through the antifuses at the point where two metal lines intersect. In this case, a subset of the antifuses are both control elements and routing resources simultaneously. Persons skilled in the art will realize that some of the arrows shown between Routing Resources 156, Control Elements 158 and Logic Modules 160 may not be present or may only be unidirectional depending on the technology employed in the PLD. An exposition of the exact details of how a programmable logic array is constructed in the various known technologies would needlessly complicate this disclosure and obscure the inventive aspects of the present invention.

Functional Block 162 can be any function that is part of and couples directly to the end user's design like, for example, an SRAM, an NVM, a digital multiplier or other arithmetic function, or a clocking circuit like a Phase-Locked Loop (PLL) or a Delay-Locked Loop (DLL). In FIG. 1 Functional Block 162 it is shown coupled to Routing Resources 156 and Control Elements 158 in a manner similar to the Logic Modules 160. While Functional Block 162 is shown completely inside Programmable Logic Array 152 in FIG. 1, most or all of it could be located outside of Programmable Logic Array 152 or even outside Programmable Logic Block 150 as long as an appropriate interface exists between it and the Routing Resources 156 and the Control Elements 158.

Programming Circuitry 154 comprises the elements of the programming circuitry that are physically pitch-matched with the rows and columns of Programmable Logic Array 152 along with some other necessary circuits that should be located in proximity to them. Programming Circuitry 154 is shown coupled to the Control Elements 158 since this is the data path for writing to them for programming (and reading from them for testing purposes in some technologies). Programming Circuitry 154 is part of the overhead circuitry of the PLD 100 relative to the end user's design.

Also shown in FIG. 1 is Programming Circuitry block 164. Programming Circuitry 164 represents the balance of the programming overhead circuits that are not present in Programming Circuitry block 154. In a currently preferred embodiment, the control elements are floating gate transistors. In order to program and erase them, substantially higher voltages than those used in the normal CMOS logic are required. These must be generated with charge pumps. The high voltages must be presented to the various terminals of the floating gate devices in precisely controlled waveforms that are properly timed relative to each other. This requires that a number of Digital-to-Analog Converters (DACs) be present between the charge pumps and the floating gate transistors. The DACs in turn require their own set of support circuits such as op amps, voltage references, etc. All of these analog circuits plus their control circuitry require a substantial amount of area to implement and are better placed outside of Programmable Logic Array 150. The proportions and divisions of the Programming Circuitry between blocks 154 and 164 can vary substantially with the technology employed in the PLD.

Functional Block 168 in FIG. 1 can be any function that is part of the end user's design like, for example, an SRAM, an NVM, a digital multiplier or other arithmetic function, or a clocking circuit like a PLL, DLL, a watch dog counter/timer, or a Real Time Clock (RTC). The difference between Functional Block 168 and Functional Block 162 is that Functional Block 168 is not directly coupled with the Routing Resources 156 and Control Elements 158 and interacts with the end user's design indirectly by means of the main firmware in the Microcontroller Block 120.

Test Circuitry 168 is also shown in FIG. 1. These circuits are used to verify and diagnose the internal circuitry of PLD 10. Like the Programming Circuitry 154 and 164, these are overhead circuits with respect to the end user's design.

Sub-bus 180 is shown coupled to the Control Registers 130, Programming Circuitry 154, Functional Block 162, Programming Circuitry 164, Functional Block 168 and Test Circuitry 168 in FIG. 1. In the embodiment of FIG. 1, Sub-bus 180 is the means by which Microcontroller Block 120 communicates with and controls the other circuits on the PLD. Sub-bus 180 is an indirect addressing scheme. Many similar schemes are known in the art. Indirect addressing means that the CPU cannot directly address the destination registers by placing an address on its own CPU bus. Rather it must load the desired destination register address into a register that serves as a pointer (typically a Control Register 130) towards the destination register. Thus a whole new address space can be created that is separate from the address space of the CPU bus. This effect is geometric. For example, an 8-bit pointer register can address 256 destination registers, while 16-bit, 24-bit and 32-bit pointers comprising two, three or four 8-bit registers respectively can manage address spaces of approximately 65 thousand registers, 16 million registers, and 4 billion registers respectively.

One advantage of this scheme is that it allows the use of a relatively simple CPU. Typically, the wider a CPU Bus 132 is, the more expensive and complex the CPU 122 is. Indirect addressing allows just a few Control Registers 130 to address as many registers as are present on a very large PLD, so a relatively inexpensive CPU can be used.

There can be multiple levels of indirection. For example, a destination register can be an address pointer to yet another address space. This could be useful, for example, if Functional Block 166 is a large memory of some type. In this case, there might be an internal pointer to the address space inside Functional Block 166. Another example would be to couple sub-busses together. This means that a register on the sub-bus would be the address pointer to a second sub-bus address space.

Persons skilled in the art will realize that many different combinations and variations on this theme are possible. Alternative embodiments will suggest themselves to such skilled persons which in no way limit the present invention.

Figure 2:
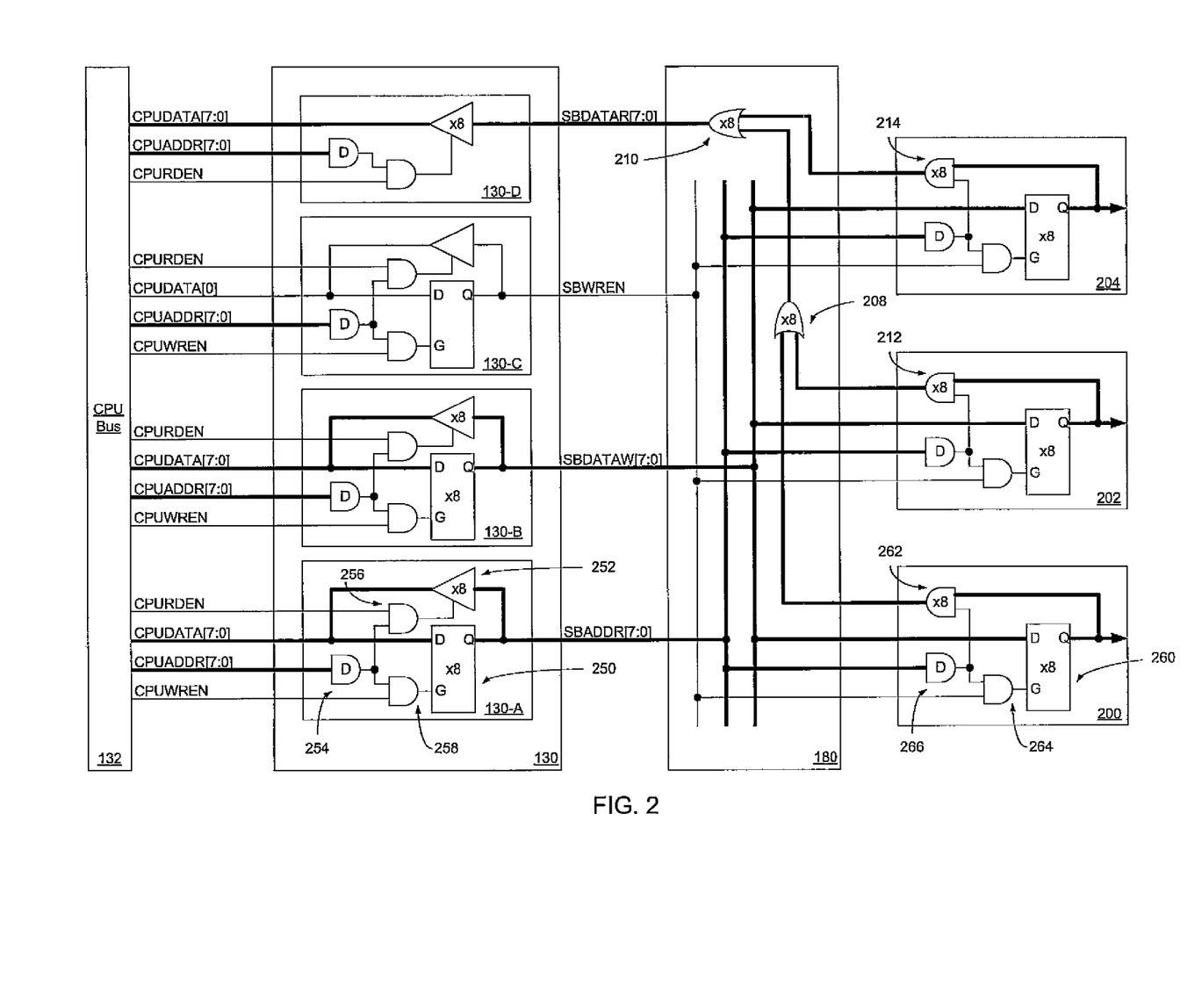
FIG. 2 shows an exemplary sub-bus suitable for use with the present invention.

Turning now to FIG. 2, an illustrative Sub-bus architecture is shown. Present in FIG. 2 are Control Registers 130, CPU Bus 132 and Sub-bus 180 shown in more detail. Also present are individual Control Registers 130-A, 130-B, 130-C and 130-D, individual Sub-bus Registers 200, 202 and 204, and two sets of eight OR-gates 208 and 210. In the figure, some components consist of eight identical components in parallel and are represented by a single symbol with a "x8" label. Also, some interconnects are busses containing eight conductors in parallel and are represented by heavy lines and an associated signal name with an index in square brackets at the end like, for example, CPUDATA[7:0]. Some signals are named. Signals starting with "CPU-" are associated with the Microcontroller Block CPU Bus 132 and signal name starting with "SB-" are associated with the Sub-bus 180. Persons skilled in the art will realize that while the illustrative Sub-bus shown in FIG. 2 has 8-bit address words and 8-bit data words, other address and data word widths are possible, and that the choice of an illustrative example with 8-bit words is to simplify the disclosure to avoid obscuring the inventive principles and is in no way limiting.

Shown in FIG. 2 are CPU Bus 132 address lines CPUADDR[7:0], data lines CPUDATA[7:0], and control lines CPURDEN (which is a read enable signal) and CPUWREN (which is a write enable signal). These signals might be part of a single CPU bus present in Microcontroller Block 120 or a secondary CPU bus designated for use by at least some of the Control Registers 130. Also shown in FIG. 2 are Sub-bus 180 address lines SBADDR[7:0], read data lines SBDATAR[7:0], write data lines SBDATAW[7:0] and a control line SBWREN (which is a write enable signal). Persons skilled in the art will realize that other CPU Bus architectures are known and the choice of which to use in a given design in no way limits the present invention. Individual control registers 130-A, 130-B, 130-C and 130-D constitute the interface between the Microcontroller Block 120 and the Sub-bus 180.

Individual Control Register 130-A is an 8-bit wide register connected to CPU Bus 132 that is both readable and writeable. Present are a set of eight 1-bit Latches designated 250 in the diagram each with a D-input, a G-input, and a Q-output. The D-inputs are each coupled to one of the eight CPUDATA [7:0] lines while the Q-outputs are each coupled to one of the eight SBADDR[7:0] lines with the CPUDATA line and SBADDR line of the same index connected to the same latch in the set.

Also present in individual Control Register 130-A are a set of eight Tri-state Buffer 252 each with a data input, an enable input and an output. The data inputs are each coupled to one of the eight SBADDR[7:0] lines while the outputs are each coupled to one of the eight CPUDATA[7:0] lines with the CPUDATA line and SBADDR line of the same index connected to the same latch in the set.

Eight-input Decoder 254 and AND-gates 256 and 258 form the control logic for individual Control Register 130-A. Decoder 254 has eight inputs and an output. The inputs are coupled to the eight CPUADDR[7:0] signals. Decoder 254 performs the logical equivalent of a Boolean AND function with a set pattern of inversions and non-inversions on its inputs. The presence of an inversion means that a value of logic-0 is selected for that input and the absence of an inversion means that a value of logic-1 is selected for that input. Thus if the selected pattern of logic-1s and logic-0s is presented to the inputs of Decoder 254 on signals CPUADDR [7:0] a logic-1 will be presented on the output. When this occurs, it means that individual Control Register 130-A has been selected by the CPU and that a write or read operation to or from this register is possible. Persons skilled in the art will realize that there are many other ways to do a decoder design and the method described is in no way limiting.

AND-gates 256 and 258 each have first and second inputs and an output. The first input of AND-gate 256 is coupled to the output of Decoder 254 and the first input of AND-gate 258, the second input is coupled to the CPU Bus 132 read enable signal CPURDEN, and the output is coupled to the enable inputs of the set of Tri-state Buffers 252. The first input of AND-gate 258 is coupled to the output of Decoder 254 and the first input of AND-gate 256, the second input is coupled to the CPU Bus 132 write enable signal CPUWREN and the second input of AND-gate 256, and the output is coupled to the G-inputs of the set of latches 250.

If a write operation to individual Control Register 130-A is desired, the address bus CPUADDR[7:0] is driven to the value of the address of individual Control Register 130-A and the data bus CPUDATA[7:0] is driven to the value of the data to be written. When the address and data are stable, a logic-1 pulse is driven on CPUWREN. Since there is a logic-1 on the output of Decoder 254, this will cause a logic-1 pulse to be driven at the output of AND-gate 258 which is coupled to the G-inputs of the Latches 250. When the G-input goes to logic-1, the latches go transparent allowing the data present on the D-inputs to pass through the latches and appear on the Q-outputs. When the G-input goes to logic-0, the latches capture and store the data and maintain it on their Q-outputs.

If a read operation from individual Control Register 130-A is desired, the address bus CPUADDR[7:0] is driven to the value of the address of individual Control Register 130-A and the address bus CPUADDR[7:0] is driven to high impedance (also known as floating). When they are stable, a logic-1 pulse is driven on CPURDEN. Since there is a logic-1 on the output of Decoder 254, this will cause a logic-1 pulse to be driven at the output of AND-gate 256 which is coupled to the enable inputs of the Tri-state Buffers 252. When the enable input goes to logic-1, the set of Tri-state Buffers 252 starts driving the CPUDATA[7:0] bus with the data present on the Q-outputs of the set of Latches 250. When the G-input goes to logic-0, the set of Tri-state Buffers 252 go back into high impedance mode releasing the data bus CPUDATA[7:0] so another circuit can drive it without conflict.

Individual Control Registers 130-B and 130-C operate in the same manner as individual Control Register 130-A, except that individual Control Register 130-C is only one bit wide. This means that during read and write operations only the value on CPUDATA[0] is relevant.

Individual Control Register 130-D is a read-only register. Since there are no latches present, no data can be written and an attempted write operation is meaningless. A read operation is performed in the same way as for Individual Control Registers 130-A, 130-B and 130-C. When a write operation is performed, the value on the SBDATAR[7:0] bus is returned on CPUDATA[7:0] instead of data from associated latches.

Individual Sub-bus Register 200 operates in a similar manner to individual Control Register 130-A. It is an 8-bit register connected to Sub-bus 180 that is both readable and writeable. It comprises eight Latches 260 that function identically to Latches 250, a set of eight AND-gates 262 each with first and second inputs and an output, an AND-gate 264 with first and second inputs and an output, and Decoder 266 which functions identically to Decoder 254.

The Q-outputs of the set of eight Latches 260 are coupled to the first inputs of the set of eight AND-gates 262 as well as being available for use somewhere inside the PLD, the D-inputs are coupled to the Sub-bus 180 write data bus SBDATAW[7:0], and the G-input is coupled to the output of AND-gate 264. The first input of each of the eight AND-gates 262 is coupled to a Q-output on one of the set of eight Latches 260, the second inputs are all coupled to the output of Decoder 266 and the outputs are coupled to the first inputs of the set of eight OR-gates 208.

The two sets of eight OR-gates 208 and 210 constitute the read back path for the individual Sub-bus registers 200, 202 and 204 on Sub-bus 180. Persons skilled in the art will realize that other numbers of individual Sub-bus registers may be used. In FIG. 2, the first inputs of the set of eight OR-gates 208 are coupled to the outputs of the set of eight AND-gates 262 in individual Sub-bus Register Cell 200, the second inputs of the set of eight OR-gates 208 are coupled to the outputs of the set of eight AND-gates 212 in individual Sub-bus Register Cell 202, and the outputs are coupled to the first inputs of the set of eight OR-gates 210. The first inputs of the set of eight OR-gates 210 are coupled to the outputs of the set of eight OR-gates 208, the second inputs of the set of eight OR-gates 210 are coupled to the outputs of the set of eight AND-gates 214 in individual Sub-bus Register Cell 204, and the outputs are coupled to the Sub-bus 180 read data bus SBDATAR[7:0] such that data that is written to Sub-bus Register 200 on the Sub-bus 180 write bus SBDATAW[i] is read back on the line with the same index "i" on the Sub-bus 180 read bus SBDATAR[i].

Eight-input Decoder 266 and AND-gate 264 form the control logic for individual Sub-bus Register 200. The second input of AND-gate 264 is coupled to the Sub-bus 180 write enable line SBWREN, and the output is coupled to the G-input on each of the Latches 260. The eight inputs of Decoder 266 are coupled to the Sub-bus 180 address bus SBADDR[7:0].

If a write operation to individual Sub-bus Register 200 is desired, the address bus SBADDR[7:0] is driven to the value of the address of individual Sub-bus Register 200 and the write data bus SBDATAW[7:0] is driven to the value of the data to be written by writing these values into individual Control Registers 130-A and 130-B respectively. When the address and data are stable, a logic-1 pulse is driven on SBWREN by writing a logic-1 into individual Control Register 130-C. Since there is a logic-1 on the output of Decoder 254, this will cause logic-1 to be driven at the output of AND-gate 264 which is coupled to the G-inputs of the Latches 260. When the G-input goes to logic-1, the latches go transparent allowing the data present on the D-inputs to pass through the latches and appear on the Q-outputs. Then a logic-0 pulse is driven on CPUWREN by writing a logic-0 into individual Control Register 130-C. When the G-input goes to logic-0, the Latches 260 capture and store the data and maintain it on their Q-outputs.

If a read operation from individual Sub-bus Register 200 is desired, the address bus SBADDR[7:0] is driven to the value of the address of individual Sub-bus Register 200. The data driven on the data bus SBADDR[7:0] and the write enable SBWREN is unimportant. When a logic-1 appears at the output of Decoder 266, the contents of the Latches 260 are driven out of Sub-bus Register 200 by AND-gates 262.

Unlike CPU Bus 132, there are no high impedance signals in Sub-bus 180. Instead, the individual Sub-bus Register addressing scheme shown in FIG. 2 guarantees that at most one individual Sub-bus Register is selected. Thus the outputs off all the other registers are driven to all logic-0s except for the selected one. This allows the use of a plurality of OR-gates such as OR-gates 208 and 210 to couple all of the outputs of all of the individual Sub-bus Registers together so that the data being read back is driven onto SBDATAR[7:0] which is coupled to read-only individual Control Register 130-D. There is no read enable signal, the read back of the addressed register begins every time the value on the address bus SBADDR[7:0] changes.

The use of Sub-bus 180 has many advantages. First, the address space available for Control Registers 130 is often limited. For example, in one embodiment of the present invention, only 128 Control registers are available to the CPU and nearly a quarter of them are reserved locations for CPU functions. In the Sub-bus 180 of FIG. 2, four Control register addresses are able to indirectly address 256 Sub-bus Registers. If a fifth individual Control Register 130-X (not shown in FIG. 2) was added which drove another eight bits of address bus SBADDR[15:8] then over sixty-five thousand Sub-bus Registers could be addressed.

Second, the timing of Sub-bus 180 is decoupled from the CPU Bus timing. Since everything that happens on Sub-bus 180 in FIG. 2 is a result of writes to Control Registers 130-A through 130-C, the timing can be lax and is measured in CPU clock cycles. Several CPU clock cycles can be allowed for read and write operations to complete. This allows Sub-bus 180 to be coupled to many different blocks on the chip and not be required to complete an operation in a single CPU clock cycle which would be a very challenging design problem if a high clock frequency is used in the CPU block.

Third, since Sub-bus 180 makes all of the long distance connections, the CPU bus 132 can be localized inside Microcontroller Block 120, its line capacitance can thus be greatly minimized, and much greater throughput can be achieved by the firmware.

Persons skilled in the art will realize that the Sub-bus 180 of FIG. 2 is illustrative only and that many details have been left out of the figure to avoid over complicating this disclosure. For example, such skilled persons will realize that the outgoing signals from the Control Registers 130 would require buffering (not shown in FIG. 2) to improve performance as would incoming signals, that OR-gates wider than two inputs could be used to efficiently combine a large number of Sub-bus Registers, that different numbers of data lines and address lines could be used, and that a tri-state bussing scheme similar to the one employed by CPU Bus 132 could be substituted. Such skilled persons will also realize that many other bus structures are known in the art and would be suitable for use with the present invention and the selection of a particular Sub-bus architecture in a particular embodiment is a matter of design choice and in no way limits the present invention.

Figure 3:
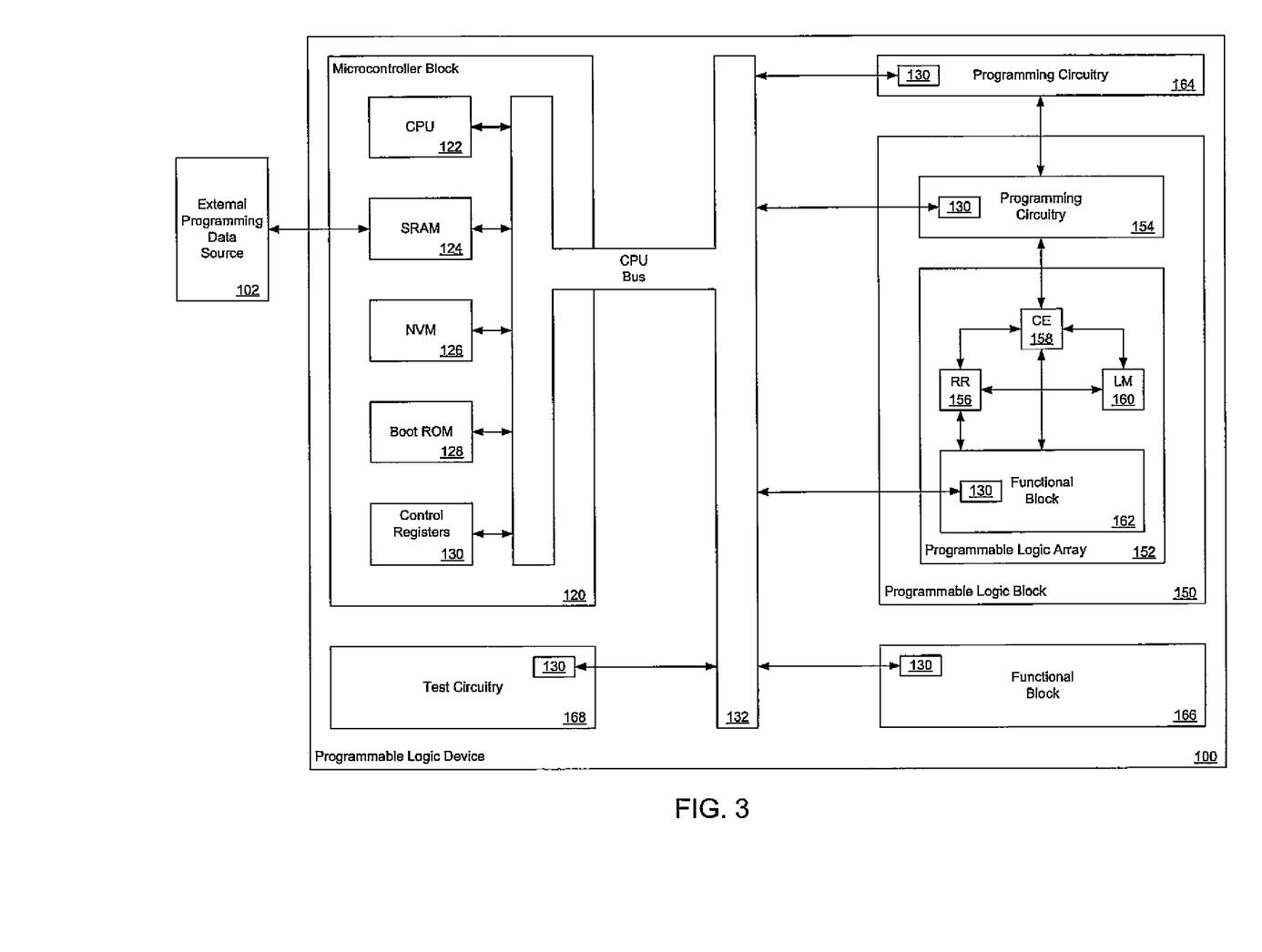
FIG. 3 shows a second illustrative embodiment of a PLD of the present invention.

FIG. 3 shows an alternative embodiment where a Sub-bus is not used. Instead the CPU Bus 132 is extended outside the Microcontroller Block 120 and coupled to every place on PLD 100 that needs to communicate with or be controlled by the firmware. Some portion of the Control Registers 130 would need to be present in these locations and these registers would perform the same tasks that the Sub-bus Registers of FIG. 2 would perform. This mitigates the advantages of using a Sub-bus but is within the scope of the present invention. Persons skilled in the art will realize that a hybrid approach is possible. For example, it might make be desirable to extend CPU Bus 132 a short distance outside of Microcontroller Block 120 for a specific purpose while using a Sub-bus to handle most of the intra-PLD communications.

Figure 4:
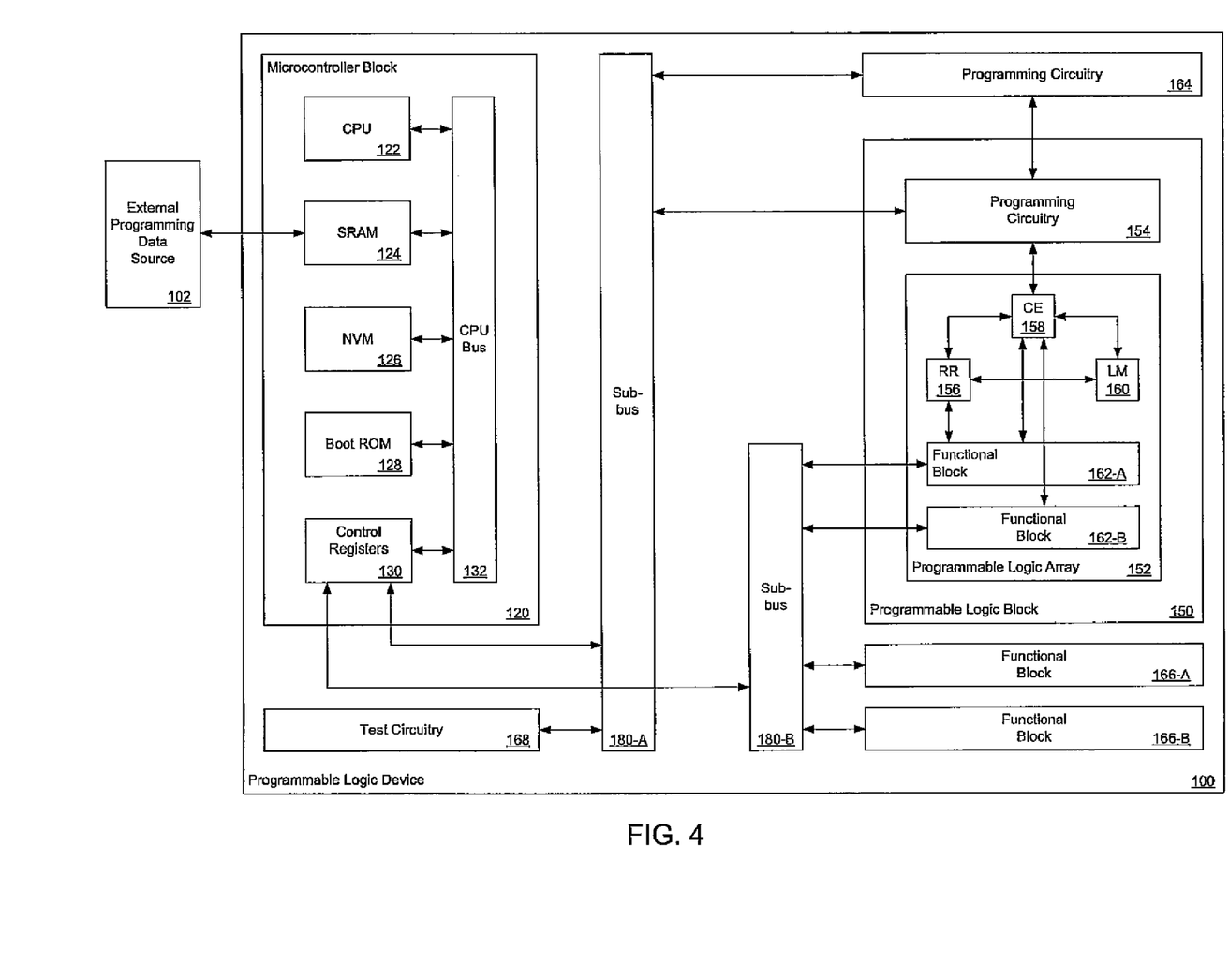
FIG. 4 shows a third illustrative embodiment of a PLD of the present invention.

FIG. 4 shows an embodiment with two separate Sub-busses 180-A and 180-B. Both are coupled to different sets of Control Registers 130 and would operate independently. Sub-bus 180-A is shown coupled to Programming Circuitry 154 and 164 and Test Circuitry 168 while Sub-bus 180-B is shown coupled to Functional Blocks 162-A, 162-B, 166-A and 166-B. In this particular case, the organization is to group all of the overhead circuits used for programming and test by coupling them to Sub-bus 180-A and then group all of the circuits that are used directly or indirectly by the end user's design by coupling them to Sub-bus 180-B. Persons skilled in the art will realize that many other organizational groupings are possible. For example, circuits might be grouped by their location on PLD 100 rather than according to function. This would allow Sub-busses to be physically compact and thus perform better. FIG. 4 also shows the use of a plurality of Functional Blocks (represented by Functional Blocks 162-A and 162-B) coupled to the routing resources and control elements in Programmable Logic Array 152. The number and types of these Functional Blocks is a matter of design choice and may vary with the size of Programmable Logic Array 152. Similarly, a plurality of Functional Blocks (represented by Functional Blocks 166-A and 166-B) can also occur outside of Programmable Logic Array 152. The number and types of these Functional Blocks is a matter of design choice and may vary with the size of PLD 100.

Figure 5:
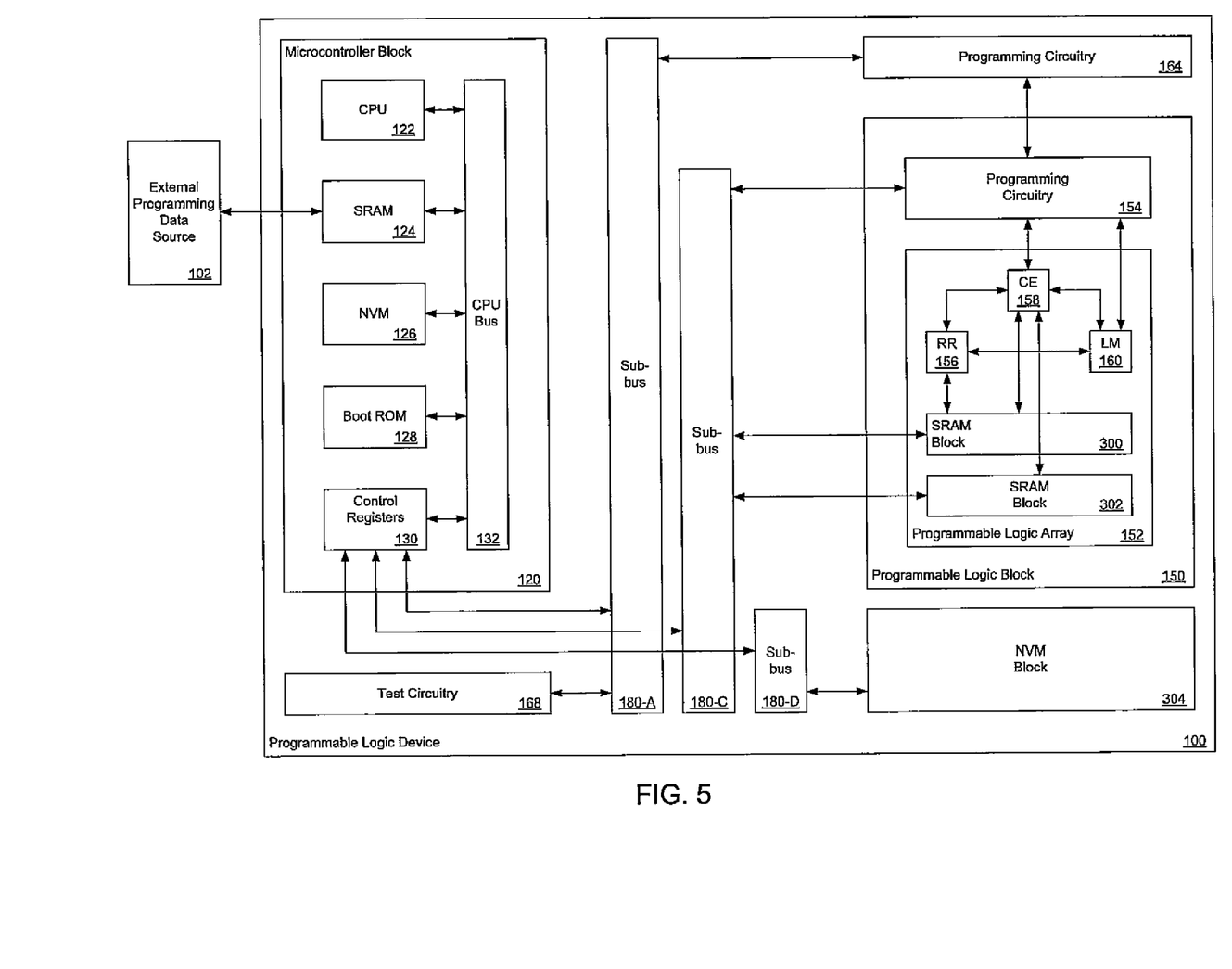
FIG. 5 shows a fourth illustrative embodiment of a PLD of the present invention.

FIG. 5 shows an embodiment of the invention where Functional Blocks 162-A and 162-B of FIG. 4 have been replaced by SRAM blocks 300 and 302, Functional Block 166 of FIG.

1 and FIG. 3 has been replaced by NVM Block 304, and Sub-bus 180-B of FIG. 4 has been replaced by Sub-busses 180-C and 180-D. In addition, Logic Modules 160 are shown directly coupled to Programming Circuitry 154 which in turn is now shown coupled to Sub-bus 180-B.

This particular arrangement is useful because it facilitates saving and restoring the contents of the volatile storage elements in Programmable Logic Array 152 to and from NVM Block 304. The volatile elements to be saved and restored include SRAM Blocks like 300 and 302 and Logic Modules 160 performing sequential logic functions like flip/flops and latches. Saving an image of the state of some or all of the logic can be advantageous for several reasons like, for example, preparing to power the system down or to go into a low power mode where the portions of PLD 100 are powered down to save dynamic power or leakage current. Similarly, restoring the logic to a known state can be advantageous for several reasons like, for example, whenever the system is powered up initially or when returning from a low power mode. If NVM Block 304 is large enough, a plurality of state images can be stored there. This would allow multitasking between several different state images which could be swapped in or out, or the system to be initialized to one of several different known states depending on certain events or conditions.

By placing all the SRAM Blocks on a separate Sub-bus from the NVM block, there is no need to keep switching the Sub-bus address back and forth between the SRAM Block and the NVM Block when doing an image restore from the NVM to the SRAM, which would happen with a single Sub-bus. Since NVM can be read very quickly (on order of one or more CPU clock cycles) this would be a significant bottleneck to quickly restoring the state after, say, a system power up or reset. Since NVM write and erase operations can take many hundreds or even thousands of CPU clock cycles, this is not so significant for image saving.

Utilizing two Sub-busses can improve the efficiency of restore operations, and some modifications to the circuitry can be made to improve the efficiency further. One approach is to add an increment function to the Control Register that generates each Sub-bus address bus (like, for example, Control Register 130-A in FIG. 2). A control bit could be used to enable or disable the increment function (like, for example, adding a second bit to Control Register 130-C in FIG. 2). While this would save the need for the firmware to be constantly doing register writes of new addresses if data is stored sequentially in both the source and destination blocks, it would still have to be reading the data from the Sub-bus coupled to the NVM Block 304 and then write it to the Sub-bus coupled to the SRAM blocks.

Figure 6:
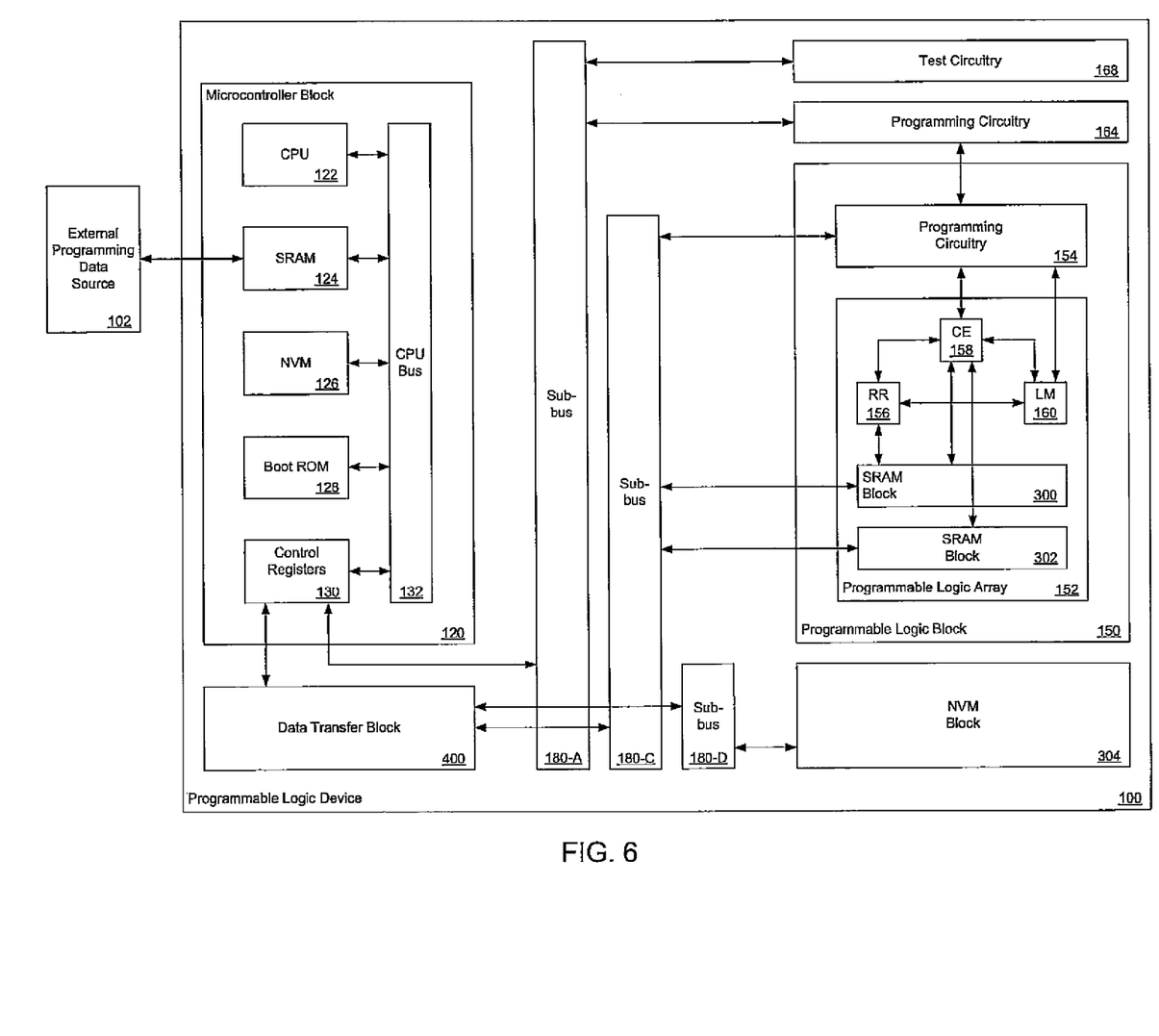
FIG. 6 shows a fifth illustrative embodiment of a PLD of the present invention.

FIG. 6 shows an embodiment of the invention including a Data Transfer Block (DTB) indicated by reference number 400. The DTB 400 is especially useful, for example, in a very large PLD 100 where doing an image restore can involve moving enough data that an unacceptably large delay can occur. DTB 400 is shown coupled to Control Registers 130 and Sub-busses 180-C and 180-D. It is a control circuit that can manipulate and control multiple Sub-busses with little or no interaction with the Microcontroller Block 120. The firmware would set up the basic parameters of the transfer of a block of data and then let the DTB 400 do the actual moving of the data. This would free up the Microprocessor Block 120 to carry on other tasks in parallel with large image restore operations.

Another facet of DTB 400 is that it can be used to efficiently and transparently transfer data between Sub-busses with different data word widths. For example, in one embodiment of the invention the SRAM and NVM block word widths are both multiples of nine bits wide while the flip/flops in the Logic Modules 160 are written and read six bits at a time. Furthermore, the flip/flops are read and written through the Programming Circuitry 154. Thus in this embodiment Programming Circuitry 154 is coupled to Sub-bus 180-C along with the SRAM Blocks. DTB 400 is thus also used as a word packer. For example, two 9-bit words read sequentially from NVM Block 304 must be repacked into three 6-bit words in order to be written into Flip/Flops in Logic Modules 160.

Figure 7:
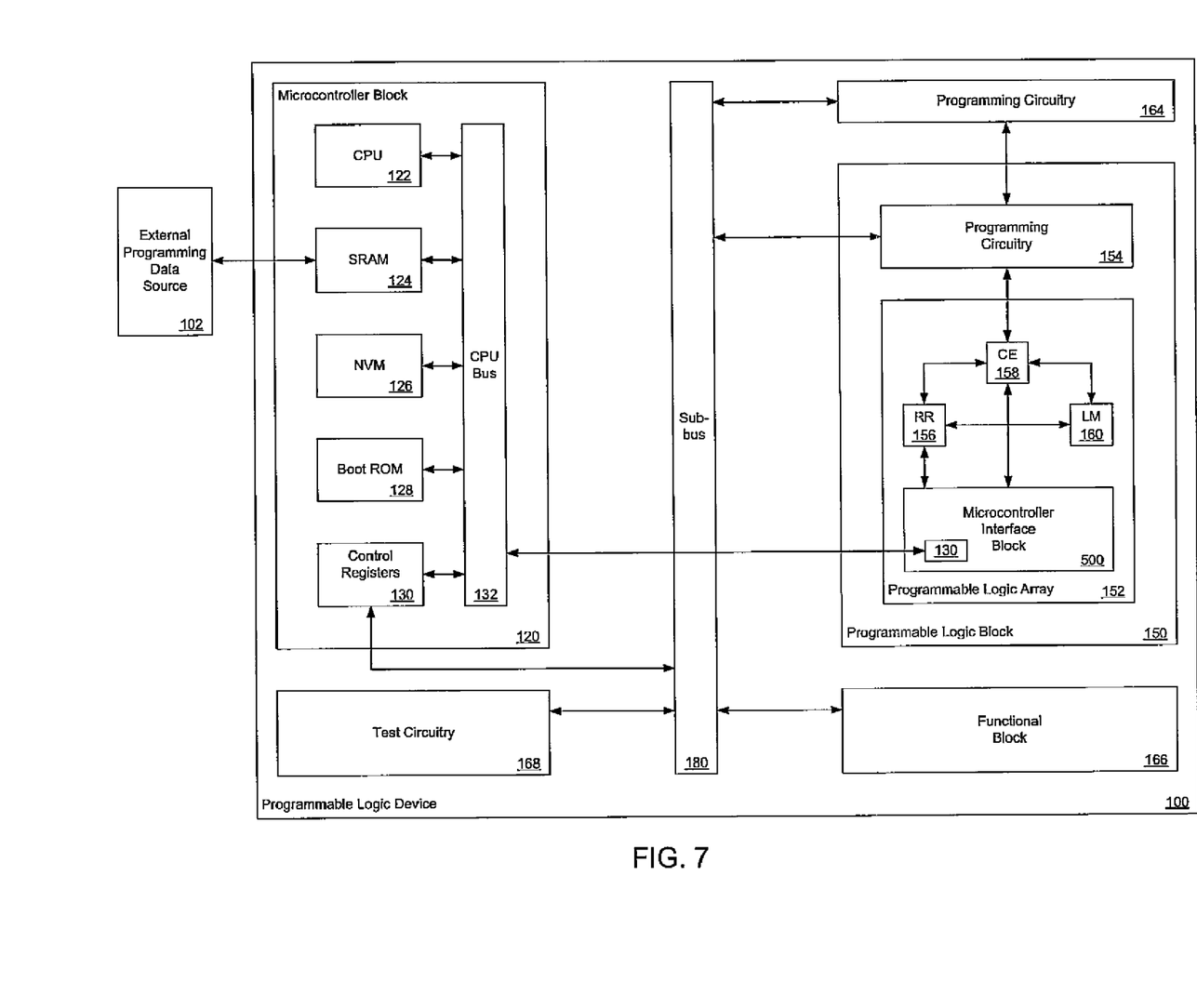
FIG. 7 shows a sixth illustrative embodiment of a PLD of the present invention.

FIG. 7 shows an embodiment of the invention with a Microcontroller Interface Block (MIB) indicated by reference number 500. MIB 500 is coupled to Routing Resources 156 and Control Elements 158. MIB block 500 is also shown comprising Control Registers 130 which are coupled to CPU Bus 132. While it is generally not advisable to extend the CPU Bus outside of Microcontroller Block 120, if the distance to MIB 500 is short then this may be an acceptable approach.

Figure 8:
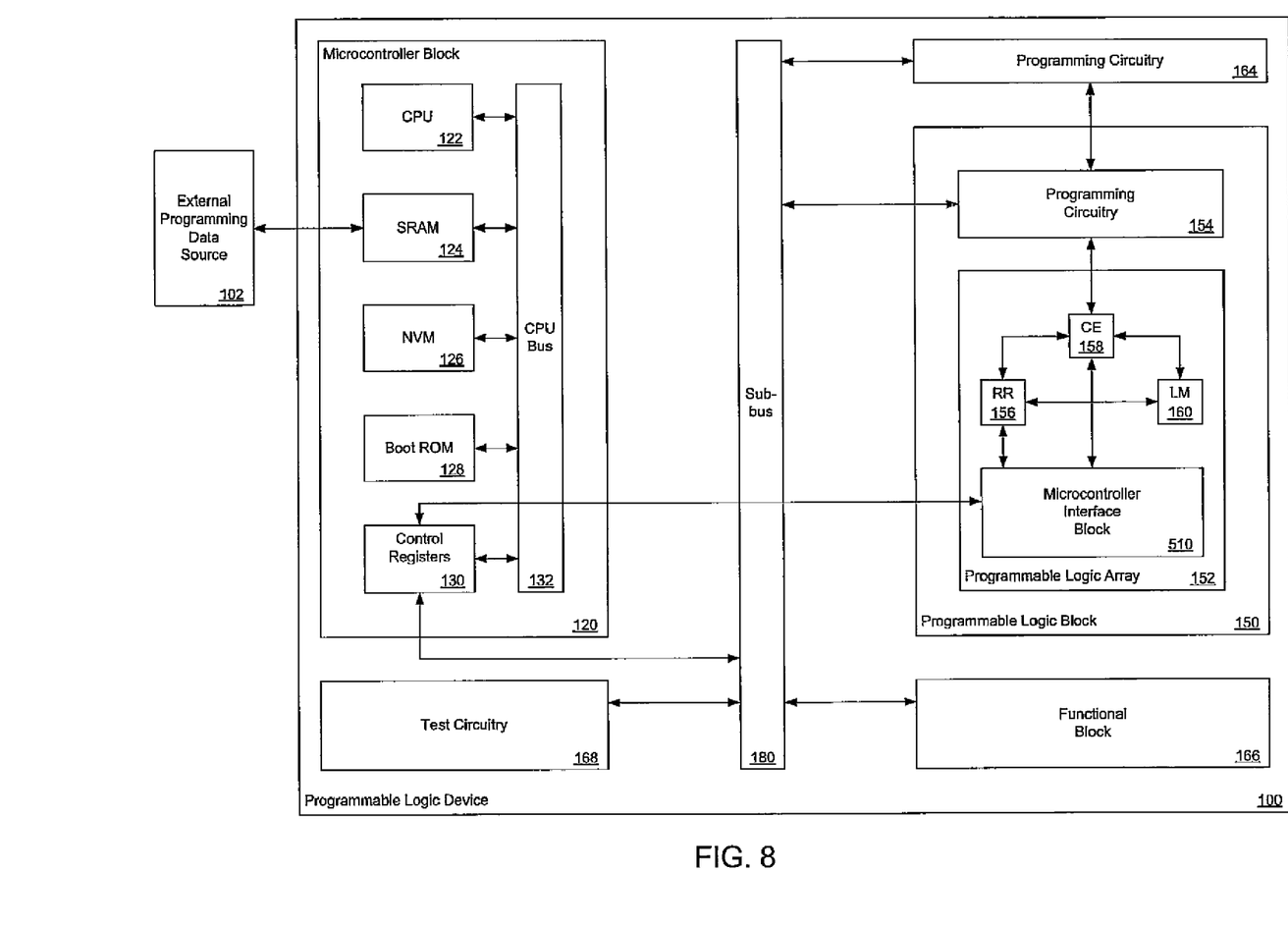
FIG. 8 shows a seventh illustrative embodiment of a PLD of the present invention.

FIG. 8 shows an embodiment of the invention with a second implementation of a Microcontroller Interface Block indicated by reference number 510. MIB 510 is coupled to Routing Resources 156, Control Elements 158 and Control Registers 130 inside Microcontroller Block 120. If the interface is relatively simple and not too many signals need to be routed between MIB 510 and Microcontroller Block 120, then this might be a preferred approach.

Figure 9:
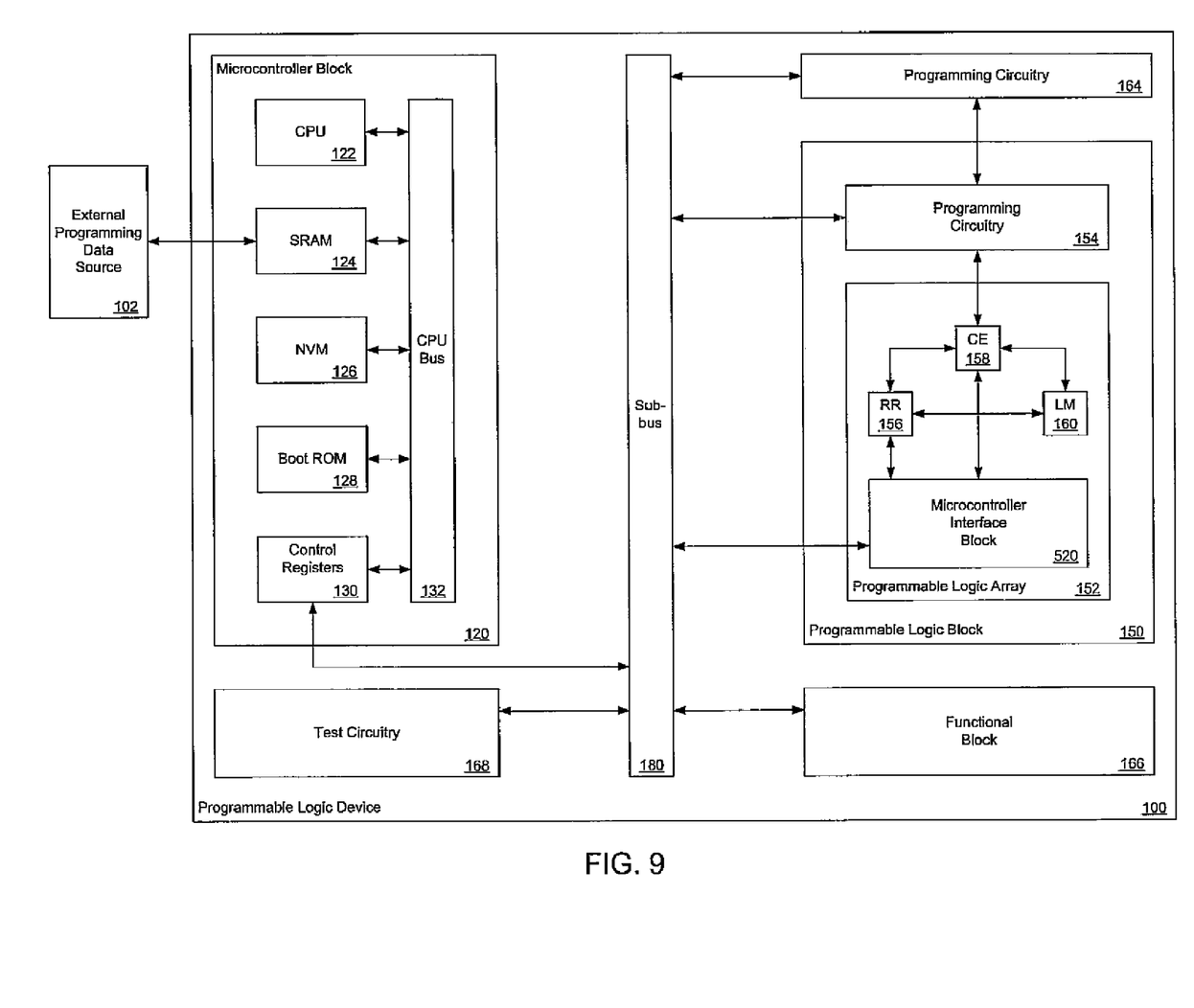
FIG. 9 shows an eighth illustrative embodiment of a PLD of the present invention.

FIG. 9 shows an embodiment of the invention with a third implementation of a Microcontroller Interface Block indicated by reference number 520. MIB 520 is coupled to Routing Resources 156, Control Elements 158 and Sub-bus 180. If the interface is relatively complex involving a lot of Sub-bus Registers internal to MIB 520 or the distance between MIB 520 and Microcontroller Block 120 is large, then this might be a preferred approach.

All of the Functional Blocks coupled to the Routing Resources 156 and Control Elements 158 (Functional Block 162 in FIG. 1 and FIG. 3, Functional Blocks 162-A and 162-B in FIG. 4, SRAM Blocks 300 and 302 in FIG. 5 and FIG. 6) can be thought of as having a Front Door and a Back Door. The Front Door can be thought of as the normal interface familiar to persons skilled in the art. In the case of SRAM Block 300 such a skilled person would expect to supply an address and a data word to perform a write operation and expect to supply an address and receive data back performing a read operation. The Front Door interface would be instantiated into an end user's logic design in much the same way that an SRAM Block would be instantiated in an end user's design in a prior art PLDs.

The Back Door can be thought of as the interface that allows the same operations to be performed during the normal operation of the end user's design under the control of the firmware in Microcontroller Block 120. These operations can be thought of as "System Services" as they can operate in parallel to the rest of the system comprising the PLD. There is no analog to this functionality in PLDs of the prior art.

The Microcontroller Interface Block 500 (or 510 or 520) allows the Microcontroller Block 120 to have a Front Door of its own. This is the interface by which the end user's design can request System Services. Because the firmware functions can be easily parameterized, the end user's design can request a very complicated Back Door operation by merely specifying a few parameters with the request and then let the firmware handle it in the background. Because the MIB 500 (or 510 or 520) is coupled to the programmable logic, part of its ultimate function in the end user's design can be built using Logic Modules 160 which can be accessed by the MIB 500 (or 510 or 520) Front Door which allows enormous flexibility for customizing the background functionality available. To be used in an end user's design, the MIB 500 (or 510 or 520) Front door is typically instantiated like the Front Door of any other Functional Block, but it can be in a completely different part of the end user's logic than the Front Doors of the Functional Blocks involved with the various System Services that can be requested. It is also possible for the design software to implicitly instantiate it based on instructions from the end user, or to omit it entirely in end user designs which do not require System Services. Additionally, PLD System Services can be requested from either inside the PLD or from outside by routing an external signal or signals to the MIB 500 (or 510 or 520) Front Door.

Thus a very flexible Microcontroller-based PLD control system has been disclosed. In addition to the traditional PLD control logic tasks of initializing the part, reading programming data from an external source, decrypting it if the programming data is encrypted for security, transferring the programming data into the control elements, initiating normal operating mode, and testing the PLD circuitry, entirely new and novel System Service functionality has been made available to the end user. Tasks such as saving and restoring the system to and from a non-volatile memory, changing the context of the part by swapping one logic state image for another, moving data between functional blocks of any type as long as they have a Back Door, smart power down, power up and system reset functions, and smart transitions into and out of low power modes are just some of what can be accomplished.

While several illustrative embodiments of the present invention have been shown, persons skilled in the art will realize that other embodiments employing the inventive principles disclosed herein are possible, and such embodiments will readily suggest themselves to such skilled persons. Thus the invention should only be limited within the spirit of the claims.

What is claimed is:

1. A programmable logic integrated circuit device, comprising:
    a microcontroller block;
    a programmable logic block comprising:
        a programmable logic array comprising:
            logic modules,
            routing resources, and
            programmable elements coupled to both the logic modules and the routing resources; and
        programming circuitry coupled to the programmable elements;
    a first sub-bus coupling the programming circuitry to the microcontroller block; and
    a functional block comprising a static random access memory block coupled to the first sub-bus and the routing resources of the programmable logic array.

2. A programmable logic integrated circuit device, comprising:
    a microcontroller block;
    a programmable logic block comprising:
        a programmable logic array comprising:
            logic modules,
            routing resources; and
            programmable elements coupled to both the logic modules and the routing resources; and
        programming circuitry coupled to the programmable elements;
    a first sub-bus coupling the programming circuitry to the microcontroller block; and
    a functional block comprising a non-volatile memory block is coupled to the first sub-bus and the routing resources of the programmable logic array.

3. A programmable logic integrated circuit device, comprising:
    a microcontroller block;
    a programmable logic block comprising:
        a programmable logic array comprising:
            logic modules,
            routing resources, and
            programmable elements coupled to both the logic modules and the routing resources; and
        programming circuitry coupled to the programmable elements;
    a first sub-bus coupling the programming circuitry to the microcontroller block;
    a functional block comprising a static random access memory block coupled to the routing resources of the programmable logic array; and
    a second sub-bus coupling the microcontroller block to the functional block.

4. A programmable logic integrated circuit device, comprising:
    a microcontroller block;
    a programmable logic block comprising:
        a programmable logic array comprising:
            logic modules,
            routing resources, and
            programmable elements coupled to both the logic modules and the routing resources; and
        programming circuitry coupled to the programmable elements;
    a first sub-bus coupling the programming circuitry to the microcontroller block;
    a functional block comprising a non-volatile memory block coupled to the routing resources of the programmable logic array; and
    a second sub-bus coupling the microcontroller block to the functional block.

5. A programmable logic integrated circuit device, comprising:
    a microcontroller block;
    a programmable logic block, comprising:
        a programmable logic array comprising logic modules, routing resources and control elements, wherein the programmable elements are coupled to both the logic modules and the routing resources, and
        programming circuitry coupled to the control elements and to the microcontroller block;
    first and second functional blocks;
    a data transfer block coupled to the microcontroller block;
    a first sub-bus coupling the first functional block to the data transfer block; and
    a second sub-bus coupling the second functional block to the data transfer block.

6. The programmable logic integrated circuit device of claim 5, further comprising:
    a third functional block coupled to the microcontroller block and the routing resources.

7. The programmable logic integrated circuit device of claim 5, wherein:
    the first functional block is coupled to the internal routing resources of the programmable logic array.

8. The programmable logic integrated circuit device of claim 7, wherein:
    the first functional block is a static random access memory block, and
    the second functional block is a non-volatile memory block.

* * * * *

UNITED STATES PATENT AND TRADEMARK OFFICE
CERTIFICATE OF CORRECTION

| | |
|---|---|
| PATENT NO. | : 7,683,660 B1 |
| APPLICATION NO. | : 12/023299 |
| DATED | : March 23, 2010 |
| INVENTOR(S) | : Bakker et al. |

It is certified that error appears in the above-identified patent and that said Letters Patent is hereby corrected as shown below:

In Claim 5, Column 16, Line 38, please insert --, programmable elements,-- prior to the phrase "and control elements"

Signed and Sealed this
Twenty-sixth Day of April, 2011

David J. Kappos
*Director of the United States Patent and Trademark Office*